United States Patent
Fehkuhrer

(10) Patent No.: US 9,786,487 B2
(45) Date of Patent: Oct. 10, 2017

(54) METHOD FOR COATING CAVITIES OF SEMICONDUCTOR SUBSTRATES

(71) Applicant: EV GROUP E. THALLNER GMBH, St. Florian am Inn (AT)

(72) Inventor: Andreas Fehkuhrer, Senftenbach (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/118,914

(22) PCT Filed: Jan. 9, 2015

(86) PCT No.: PCT/EP2015/050283
§ 371 (c)(1),
(2) Date: Aug. 15, 2016

(87) PCT Pub. No.: WO2015/144319
PCT Pub. Date: Oct. 1, 2015

(65) Prior Publication Data
US 2016/0365241 A1 Dec. 15, 2016

(30) Foreign Application Priority Data
Mar. 26, 2014 (DE) .................. 10 2014 104 239

(51) Int. Cl.
| H01L 21/00 | (2006.01) |
| H01L 21/44 | (2006.01) |
| H01L 21/02 | (2006.01) |
| H01L 21/768 | (2006.01) |
| B08B 3/08 | (2006.01) |
| B08B 3/12 | (2006.01) |
| B08B 5/00 | (2006.01) |
| B08B 7/00 | (2006.01) |

(52) U.S. Cl.
CPC .......... *H01L 21/02057* (2013.01); *B08B 3/08* (2013.01); *B08B 3/12* (2013.01); *B08B 5/00* (2013.01); *B08B 7/0014* (2013.01); *B08B 7/0035* (2013.01); *H01L 21/76898* (2013.01)

(58) Field of Classification Search
None
See application file for complete search history.

(56) References Cited

U.S. PATENT DOCUMENTS

| 8,586,132 | B2 | 11/2013 | Thallner | 427/96.7 |
| 2006/0243701 | A1* | 11/2006 | Ono | B41J 2/14072 216/27 |
| 2007/0148934 | A1 | 6/2007 | Cho et al. | 438/585 |
| 2008/0280435 | A1* | 11/2008 | Klootwijk | H01L 21/764 438/667 |
| 2009/0155977 | A1 | 6/2009 | Han et al. | 438/424 |
| 2010/0120260 | A1 | 5/2010 | Lee et al. | 438/759 |
| 2010/0258917 | A1 | 10/2010 | Lin | 257/621 |
| 2010/0301491 | A1 | 12/2010 | Yang | 257/773 |
| 2013/0034816 | A1 | 2/2013 | Yu et al. | 430/313 |

FOREIGN PATENT DOCUMENTS

| DE | 4433846 C2 | 3/1996 | .......... H01L 21/283 |
| DE | 102011013228 A1 | 9/2012 | .......... H01L 21/768 |
| EP | 1420483 A3 | 3/2005 | ......... H01L 21/3065 |
| WO | WO 2007/054867 A2 | 5/2007 | .......... H01L 21/768 |

OTHER PUBLICATIONS

International Search Report from corresponding International Patent Application No. PCT/EP2015/050283, dated Apr. 1, 2015.
Huang et al., "Implementation of Air-Gap Through-Silicon-Vias (TSVs) Using Sacrificial Technology," IEEE Transactions on Components, Packaging and Manufacturing Technology, IEEE, USA, vol. 3, No. 8, Aug. 1, 2013, pp. 1430-1438; pp. 1431-1432; and Figs. 2 and 3.

* cited by examiner

*Primary Examiner* — Calvin Choi
(74) *Attorney, Agent, or Firm* — Kusner & Jaffe

(57) ABSTRACT

A method for temporary coating of cavities, which at least partially run through a semiconductor substrate and are provided for a permanent coating and/or equipping, with a temporarily applied coating material before processing steps for processing at least one surface of the semiconductor substrate. In addition, a method for removing a temporary coating of cavities of a semiconductor substrate, whereby the coating is applied according to a previously-mentioned method and whereby, in particular immediately afterwards, a permanent coating and/or equipping of the cavities is carried out.

20 Claims, 2 Drawing Sheets

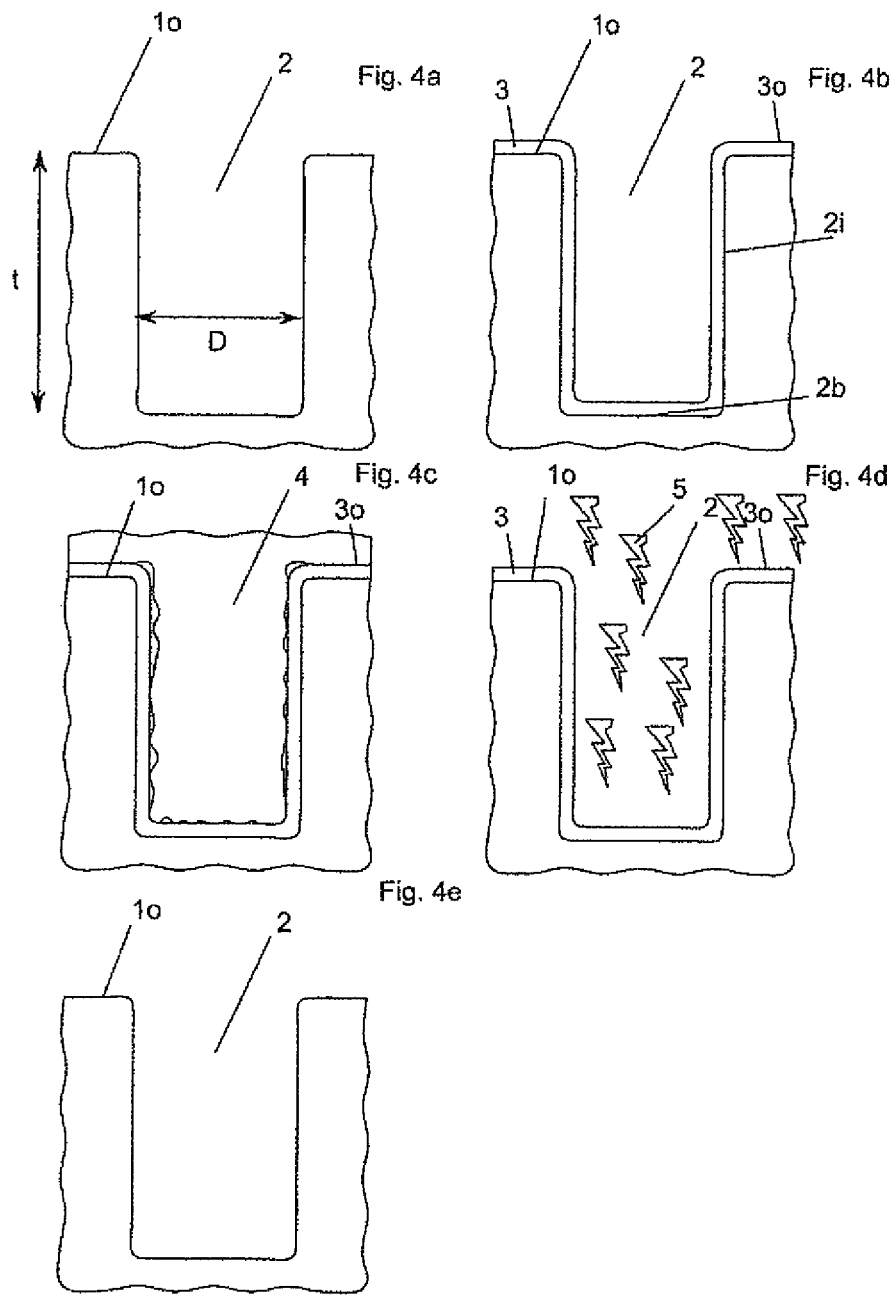

METHOD FOR COATING CAVITIES OF SEMICONDUCTOR SUBSTRATES

FIELD OF THE INVENTION

This invention relates to a method for coating cavities, at least partially running through a semiconductor substrate, with a coating material, as well as a method for removing a coating from cavities of a semiconductor substrate.

BACKGROUND OF THE INVENTION

In the semiconductor industry, the trend toward three-dimensional structures has been evident for several years now. Although a start was made with stacks of varying functional units more than ten years ago, the connections between these structures could only be produced in an expensive manner using outer wiring. This wiring was performed by wire bonders. The wiring is costly, susceptible to flaws and accordingly takes up a great deal of space.

For some years now, therefore, work has been underway on technologies in which the wiring of the varying functional units is carried out vertically by a substrate or by a chip. These passages are called vias. Vias in silicon are called TSVs (i.e., "through silicon vias"), and vias in polymer are called TPVs (i.e., "through polymer vias").

All via technologies have in common the fact that they are produced in a basic substrate by drilling, milling or—preferably because of the very small dimensions in most cases—by etching. The smaller the vias, the more expensive the production technology. Since to date vias are already produced in the µm scale, virtually only drilling and etching techniques are taken into consideration.

Among drilling technologies, laser drills are the overwhelming choice. High-energy, extremely collimated laser beams produce such a high, locally greatly limited heat that vaporizes the basic material. By the laser drilling, vias with very large aspect ratios of diameter to depth can be provided. The laser drilling technology is used primarily in polymers. The vias through the polymers are referred to as "through-polymer-vias" or simply only as TPVs. Polymers can be thermally decomposed much more easily than metals or semiconductor materials.

Another type of production is the etching of vias. When using etching techniques, the surfaces of the substrates that are to be etched must first be masked and then treated with the respective chemicals.

After the production of vias, several possibilities of filling exist. On the one hand, only the surfaces of the vias can be coated with metal in order to thus produce a hollow conductor. On the other hand, the vias can be filled completely. The selection of the coating depends mainly on the use of the vias. Volume-filled vias are preferably better suited for higher current densities, while hollow conductor vias can be better used for other types of electronic loads.

A problem in the state of the art is that between the process step of the via production and the process step of the via coating or equipping, other process steps can be applied or must be applied to the substrate. These interposed process steps fairly often contaminate the vias that are produced. Although the contamination of the vias is done quite quickly, the corresponding and necessary cleaning is costly, time-consuming and fairly often incomplete. In the worst case, an incorrectly cleaned via can be coated incorrectly and thus leads to scrapping.

If, for example, a functional unit with 20 vias is connected to a second functional unit, the contamination of a single via is sufficient to make the entire functional unit unusable. Contamination of vias thus reduces the corresponding yield and raises unit prices.

Among all possible process steps that result in a contamination of vias, primarily the coating of the substrate surface with a temporary adhesive stands out. Temporary adhesives, so-called bonding adhesives, are polymers whose object is temporarily connecting to one another a product substrate, in particular a product wafer, to a carrier substrate, in particular a carrier wafer. Vias already present in the product substrate can be contaminated by temporary adhesives. After the product substrate was further processed and ultimately removed from the carrier substrate, the contaminated vias must be cleaned. The chemical properties of the temporary adhesive have an especially disadvantageous effect on the cleaning of the vias, since the temporary adhesive (primarily at low temperatures) has a high viscosity. The high viscosity of the temporary adhesive at room temperature, in particular at 20° C., is desired for the actual temporary bonding process in order to connect the product substrate firmly to the carrier substrate. In most debonding processes, the temperature must be elevated to remove the product substrate and the carrier substrate in order to reduce the viscosity of the temporary adhesive. Since the cleaning process, however, follows the debonding process and cannot be performed simultaneously, the viscosity in general increases again to a very high value, having a negative effect on the cleaning, by a dropping of the temperature between the debonding process and the cleaning process. In the case of debonding processes, which are performed at room temperature, the temporary bonding adhesive never reaches a low viscosity value.

In general, in order to be able to clean the vias, the product substrates must be put in a chemical bath after the debonding and be exposed in particular to ultrasound. Both treatment steps lay claim to the product substrate, in particular take time, and thus increase costs.

SUMMARY OF THE INVENTION

The object of this invention is to indicate a method with which the processing of semiconductor substrates with cavities, in particular vias, is optimized.

This object is achieved with the features of the independent claim(s). Advantageous further developments of the invention are indicated in the subclaims. All combinations that include at least two features indicated in the specification, in the claims and/or the drawings also fall within the scope of the invention. In the indicated ranges of values, values as boundary values that lie within the above-mentioned limits are also to be regarded as disclosed and can be claimed in any combination.

On the one hand, the invention relates to a method for temporary coating of a surface of cavities that at least partially, and preferably primarily (more than up to half the thickness of the semiconductor substrate), run through a semiconductor substrate. Cavities are in particular vias, preferably boreholes, clearance holes, contact holes in general, but any type of recess with respect to the surface of the substrate. Vias are produced in particular in order to coat or fill them permanently with an electric material, in particular a metal, in most cases copper, so that a conductive connection between the two semiconductor substrates is produced. Cavities are also used in particular for equipping with or for receiving functional components, preferably LEDs or MEMs.

The object of the temporary coating comprises in particular in a simple, fast and primarily economical removal of foreign substances, which can penetrate the cavities/vias during one or more process steps. It is therefore essential to the invention to perform the coating before the processing of at least one surface of the semiconductor substrate and thus before a contamination.

Such a processing step is in particular the coating of at least one of the surfaces of the semiconductor substrate, preferably with a bonding adhesive. The following processing steps are alternative according to the invention or conceivable cumulative to the above-mentioned:
Mechanical surface processing processes
Grinding
Polishing
Treatment with liquids
Etching
Washing
Coatings
Gas phase depositions, such as PVD, CVD, PECVD
Molecular beam depositions
Electrochemical depositions
Sputtering
Application of polymers
  Temporary adhesives
  Enameling with photoresist, so-called resist The invention thus describes in particular a method to coat the cavities/vias before a process step, which could contaminate the cavities/vias, with a material that has a low adhesion to other materials, and can preferably be easily removed. In addition, the coating according to the invention prevents or hampers at least the deposition and the adhesion of contaminants to the surface of the cavities.

According to a separate aspect of the invention, the invention relates to a method for removing a coating from cavities/vias of a semiconductor substrate, whereby the coating is applied in particular according to a previously-described method. The removal is done in particular according to the above-mentioned processing steps, whereby with the removal, in particular also some contaminants are removed, preferably extracted from the cavities/vias. In particular, immediately after the removal, the permanent coating/equipping of the vias/cavities is carried out.

The coating is comprised in particular of a material that can be removed more easily than contaminants produced by the processing steps. In special cases, the coating and/or the contaminants are removed more than 1×, preferably more than 10×, more preferably more than 50×, most preferably more than 100×, and with utmost preference more than 1000× as quickly as the removal of the contamination without the coating according to the invention would take place. In particular, the cleaning step of the contaminants and the removal of the temporary coating according to the invention can take place separately from one another. This is primarily advantageous when several process steps lie between the production of the coating according to the invention and its final removal, which steps contaminate the cavities/vias. In a quite especially preferred embodiment, however, contaminants and temporary coating are simultaneously removed.

Another aspect according to the invention is the preferred removal of contaminants from the cavities/vias at the lowest possible temperatures and in particular in a chemically neutral and/or non-basic and/or non-acidic and/or non-toxic environment.

The temperature for removing contaminants from the cavities/vias is in particular less than 500° C., preferably less than 300° C., most preferably less than 100° C., and even more preferably room temperature.

In combination, the invention describes in particular a method to coat the surface of cavities/vias of the semiconductor substrate in order to be able to more quickly remove a contamination of the cavities/vias that possibly took place after several processing steps. The cavities/vias are not filled with the coating in particular, but rather preferably only a coating that is thin with respect to the diameter of the cavities/vias is applied. On the condition of an in particular radially symmetrical VIA, the ratio between the coating thickness and the radius of the VIA is less than 0.5, preferably less than 0.1, more preferably less than 0.01, most preferably less than 0.001, and with utmost preference less than 0.0001. The coating thickness is in particular less than 1 μm, more preferably less than 100 nm, most preferably less than 10 nm, with utmost preference less than 1 nm, and all the more preferably the coating thickness includes only a single monolayer of the coating material.

The embodiment according to the invention is suitable in principle for all types of cavities. Hereinafter in the patent specification, a special type of cavity, the via, is described as representative of all types of cavities. To one skilled in this field, it is clear that the method according to the invention, however, is not only limited to vias, but rather can be used for any type of cavity. The use in the case of vias represents the preferred embodiment according to the invention.

One aspect according to the invention includes using a coating material that preferably has the following properties. The coating material is suitable in particular for the coating of the surface of the semiconductor substrate that is to be coated, is preferably as economical as possible and stable at least until the cavities/vias are cleaned. Stability is defined according to the invention as the adhesion between the surface of the cavities/vias being as high as possible. The adhesion is preferably defined by the energy per unit of surface area, which is necessary to separate from one another two surfaces that are connected to one another. In this case, the energy is indicated in $J/m^2$. The energy per unit of surface area is in particular greater than $0.00001$ $J/m^2$, preferably greater than $0.0001$ $J/m^2$, more preferably greater than $0.001$ $J/m^2$, most preferably greater than $0.01$ $J/m^2$, with utmost preference greater than $0.1$ $J/m^2$, and even more preferably greater than $2.5$ $J/m^2$. In addition, stability is defined as the coating during additional process steps not changing with respect to the physical and/or chemical properties thereof. In addition, the coating material preferably has a property of low adhesion to other materials, in particular contaminants from processing steps between the temporary coating and the permanent coating/equipping, but at least to all materials that can contaminate the cavities/vias during additional process steps.

In particular, these include the following materials:
Organic materials, in particular
Polymers, preferably
  Thermoplasts, preferably
    Temporary adhesives and/or
  Thermoset materials and/or
  Elastomers and/or
  Photoresists and/or
Carbon compounds, in particular
  Graphites and/or
  Buckminsterfullerenes and/or
  Graphene and/or
  Carbon nanotubes and/or
Inorganic materials, in particular
Metals and/or
  Al, Pt, Au, Ag, Cu, W, Zn, Sn, Pb, Mo, Ti, Fe and/or Semiconductors, in particular
   III-V: GaP, GaAs, InP, InSb, InAs, GaSb, GaN, AlN, InN, InN, $Al_xGa_{1-x}As$, $In_xGa_{1-x}N$ and/or
   IV-IV: SiC, SiGe and/or
   III-VI: InAlP and/or
Ceramics and/or
Liquids, in particular
Acids and/or bases.
Adsorbing gases.

In addition, the coating material preferably has a low adhesiveness to the contaminants, which can be deposited in the vias. The energy of the coating material or the coating per unit of surface area is in particular lower than 2.5 J/m2, preferably less than 0.1 J/m2, more preferably less than 0.01 J/m2, most preferably less than 0.001 J/m2, with utmost preference less than 0.0001 J/m2, and even more preferably less than 0.00001 J/m2.

The coating material is preferably formed from a high-adhesive part, which adheres to the surface of the vias, and a low-adhesive part, which points into (i.e., faces) the interior of the vias and thus comes into contact with the contaminants.

The application of the coating is preferably carried out by a centrifugal enameling process, but other coating methods—primarily those that are suitable for batch processes—can be used, in particular:
   Spray-enameling
   Dip coating
   Electrochemical deposition
   Coating by precipitation reactions, Preferably, the coating material is a molecular organic compound. More preferably, it is an anti-adhesive layer material. Most preferably, it is one of the following materials:
   Polymers, in particular
   Fluoropolymers, preferably
      Not dissolved in solvent, or
      Dissolved in solvent (preferably), in particular
         Dissolved in hydrofluoroether solvent.

According to an advantageous embodiment of this invention, the coating material with a coating thickness b that is less than or equal to half the mean diameter D of the cavities is applied at least on an inner periphery and a base of the cavities. The coating is applied as homogeneously as possible, whereby the coating thickness d can be considered to be a mean coating thickness. The cavities are preferably cylindrical cavities, whereby the mean diameter of the cylinder can be considered to be diameter D, whereby bevels or roundings that are present in particular at a transition to the base of the cavities can be ignored. In the case of the complete filling of the cavities/vias, the material is used as a protective barrier in order to prevent absolutely any penetration of contaminants. This embodiment according to the invention is only technically and economically useful if the thus used coating material can also be removed extremely quickly and primarily unproblematically again from the cavity/via, since the coating material otherwise itself represents a contaminant.

The coating material can be applied in particular first over the entire surface, and excess coating material can be extracted by rotation of the substrate, so that a homogeneous coating remains. Especially preferably, the coating material is applied by the method that is mentioned in the publication U.S. Pat. No. 8,586,132 B2. This method is suitable in particular for coating vias.

It is especially preferred when the coating material in the case of the coating is applied in addition to intermediate surfaces of the semiconductor substrate running between the cavities. Thus, not only the cavities are protected, which can be advantageous in particular in the case of specific, subsequent processing or treatment steps.

After, between or before some treatment or processing steps downstream from the coating, it is conceivable according to the invention to remove the coating material at the intermediate surfaces after the coating, in particular completely, without removing coating material applied in the cavities. In this way, the intermediate surfaces of the semiconductor substrate that are optionally to be processed are open for processing, while the inner periphery and the base of the cavities are protected by the coating material. The removal of the coating material is in this case carried out physically and/or chemically. A physical removal would be in particular a polishing and/or grinding process. The contaminants produced in this way would in this case penetrate the cavities/vias, but the latter would be protected by the coating according to the invention. In a subsequent cleaning process, a quick and efficient cleaning could be performed. A chemical removal would be carried out in particular by a wet-chemical process.

The most important thing in this respect would be to ensure that the liquid did not penetrate into the cavities/vias, since otherwise the coating material in the cavities/vias would also be destroyed. The penetration of the liquid could be prevented in particular by a quickly-rotating substrate, preferably by spin-etching. The use of highly viscous etching means, whose high viscosity and high surface tension do not allow the liquid to penetrate into the cavities/vias, would also be conceivable.

In further development of this invention, it is provided according to an advantageous embodiment to remove the coating material at the intermediate surfaces by centrifuging, in particular by a spin-etching process, in particular in connection with the application of a solvent for dissolving the coating material, at least partially, preferably completely. In the case of a partial removal of the coating material at the intermediate surfaces arranged in particular in a plane, preferably only a circular wall section of the surface of the semiconductor substrate is cleared of the coating material.

In this way, an edge section can be exposed to an adhesive material in order to attach the semiconductor substrate only in this edge section to another substrate. In the case of complete removal of the solvent at the intermediate surfaces, a flat surface that is cleared of the coating material remains, which surface is open with respect to the additional processing steps.

Another, in particular independent aspect of the invention is the cleaning of a substrate that is coated with an above-described method and processed with processing steps. Particularly during the processing steps, there is an intake of contaminants, in particular adhesive (for example bonding adhesive), which above all can penetrate in the cavities. The coating according to the invention greatly simplifies and accelerates the cleaning. An especially preferred removal of the contamination from the cavities/vias is done, however, preferably with ultrasound action, while the substrate is located in a solvent.

One aspect according to the invention is the fact that an optionally used ultrasound can clear the cavities/vias of the contaminants in an extremely short time, in contrast to the state of the art, based on the extremely low adhesion between the coating and the contaminant. The cleaning process according to the invention is even more efficient when the substrate, according to an advantageous embodiment of the invention, is rotated in the solvent during the exposure to ultrasound. In an even more preferred embodiment, the cavities/vias are oriented in the gravitational direction during the ultrasound exposure in the solvent bath and the rotating movement, so that in addition, the force of weight acts on the contaminants if the latter have a higher density than the solvent.

Because of the extremely low adhesion between contaminants and coating, a removal of the contaminants also with the help of gases is conceivable according to an advantageous embodiment of the invention. In this case, the gases are injected into the substrate under a specific angle of incidence. The gases preferably penetrate into the cavities/vias and convey the contaminants to the substrate surface. The angle of incidence of the gas flow is in particular less than/equal to 90°, preferably less than 70°, even more preferably less than 50°, most preferably less than 30°, and all the more preferably less than 10°. In a quite especially preferred embodiment, the gas is injected parallel to the substrate surface and produces an underpressure above the cavities/vias. Gases that can be used according to the invention are in particular Air and/or
Inert gases, in particular
    Argon and/or
    Helium and/or
    Nitrogen and/or
    Carbon dioxide and/or
    Ammonia and/or
Reactive gases, in particular
    Hydrogen and/or
    Oxygen and/or
    Carbon monoxide.

In an even more preferred embodiment, the substrate, in particular in the case of an almost parallel gas flow relative to the substrate, is rotated during the exposure to the gas relative to the gas flow. With a gas flow that is almost normal relative to the substrate, the substrate during exposure to the gas is preferably moved in a translatory manner relative to the gas flow. A combination of rotary and translatory movement of the substrate relative to the gas flow is also conceivable.

In particular in connection to the cleaning or at the same time with the cleaning, a removal of the coating from the cavities/vias of the semiconductor substrate is carried out according to another, in particular independent, aspect of the invention, whereby the coating is applied and designed as previously described.

In an especially preferred manner, the removal is carried out by introducing one or preferably multiple coated substrates into a solvent bath that is filled with a solvent for dissolving the coating material. In particular, the semiconductor substrate does not need to be rotated around its own axis in this case. Exposure to ultrasound and/or rotation of the substrate around an axis while it is lying in a solvent bath can accelerate the removal of the coating material.

The removal of the coating material can therefore be supported in particular by exposure to ultrasound of the solvent in the solvent bath.

Although the cleaning of the substrates with wet-chemical methods is conceivable, cleaning of the coating material is more preferably carried out with plasma. Alternative cleaning methods are:

Chemical, in particular
    With solvent, preferably
        Gaseous or
        Liquid
    Plasma
Physical, in particular
    Plasma, preferably
        Inductive plasma or
        Capacitive plasma or
        Remote plasma.

Further advantages, features and details of the invention follow from the description of preferred embodiments as well as based on the drawings.

In the figures, the same components or components that have the same effect are identified with the same reference numbers. The drawings show only diagrammatically the embodiments according to the invention and are not to scale. Thus, primarily the relative thicknesses of the coating material 3 and the substrates 1 are disproportionate to one another, just as is the ratio of the above-mentioned thicknesses to the diameters of the substrates 1.

DETAILED DESCRIPTION OF THE INVENTION

Figure 1:
FIG. 1 a cross-sectional view of a semiconductor substrate with cavities according to the invention, FIG. 2 an enlarged cutaway of the cavities of FIG. 1 after a coating with a coating material according to the invention, FIG. 3 a step according to the invention of an embodiment of this invention, FIG. 4a a first step of a first embodiment of the method according to the invention, FIG. 4b a second step of a first embodiment of the method according to the invention, FIG. 4c a third step of a first embodiment of the method according to the invention, FIG. 4d a fourth step of a first embodiment of the method according to the invention, and FIG. 4e a fifth step of a first embodiment of the method according to the invention.
Figure 2:
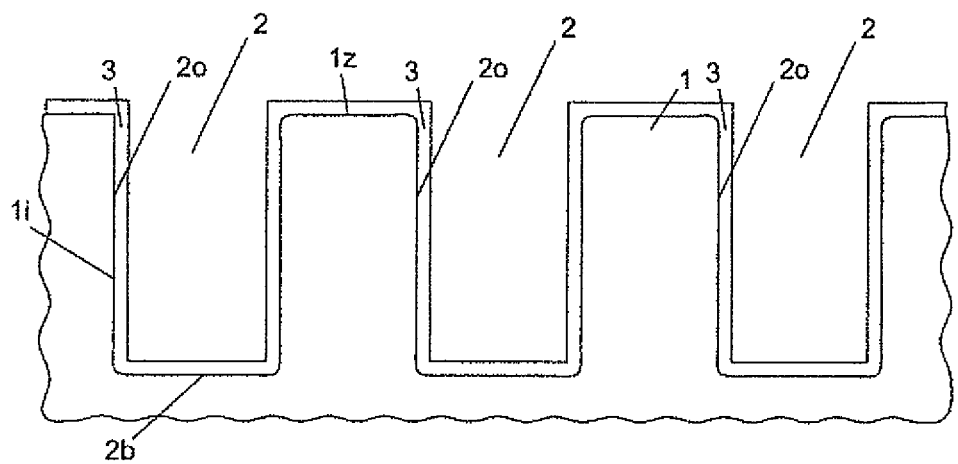

In a first embodiment according to the invention in accordance with FIG. 2, a coating material 3, provided as a protective layer from contaminants, is applied in particular in a centrifugal enameling device, completely on a surface 1o of a semiconductor substrate 1. The coating material 3 penetrates into cavities 2 during the coating process. The coating material 3 covers not only a surface 2o of the cavities 2 but rather also outer intermediate surfaces 1z of the substrate surface 1o. Thus, the coating according to the invention of the surface 2o of the cavities 2 is finished. This embodiment according to the invention is in particular suitable if the substrate surface 1o outside of the cavities 2 is further processed so that the coating material 3 at the intermediate surfaces 1z is not disturbed. Such a simple embodiment would be conceivable primarily in the case of back-grinding processes, back-thinning processes, and etching processes.

Figure 3:
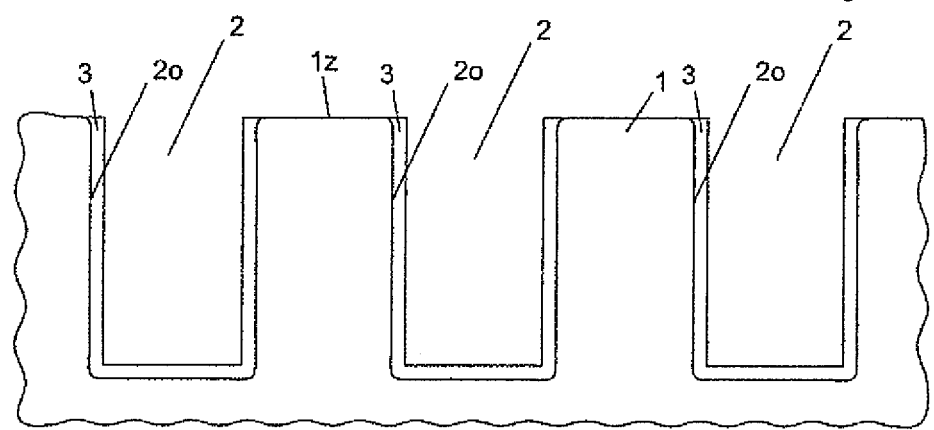

In a second embodiment according to the invention in accordance with FIG. 3, the coating material 3 is applied, in particular in a centrifugal enameling device. After the coating material 3 has penetrated into the cavities 2, in particular immediately afterwards, a centrifuging process, in particular at high speed, and/or a cleaning exclusively of the intermediate surfaces 1z of the surface 1o of the semiconductor substrate 1 is/are performed with a solvent for the coating material. The speed is in particular higher than 1 rpm (i.e., rotations per minute"), in particular higher than 10 rpm, preferably higher than 100 rpm, and more preferably higher than 1,000 rpm.

The speed of the centrifugal enameling device is selected so that the solvent for the coating material 3 does not penetrate into the cavities 2, so that the coating material 3 according to the invention remains at least predominantly, preferably virtually completely, in the cavities 2. Thus, only the cavities 2 are coated with the coating material 3 according to the invention.

A subsequent removal of the coating material 3 at the intermediate surfaces 1z, performed after the coating of the coating material 3, by any physical and/or chemical process is also conceivable.

The substrate surface 1o above the cavities 2 is cleared, in particular completely, of the coating material 3 and can therefore be further treated or processed at will.

During the further processing of the substrate surface 1o, contaminants can penetrate into the cavities 2, in particular a temporary adhesive during a temporary bonding. An adhesion to an inner periphery 2i or a base 2b of the cavities 2 is prevented or at least hampered by the low-adhesive coating material 3, so that the contaminants can be removed easily or more easily.

After the processing of the semiconductor substrate 1, cleaning according to the invention of the cavities 2 is carried out. Based on the use according to the invention of the coating material 3, the contaminants can be removed easily, quickly, inexpensively and in an energy-efficient manner from the cavities 2.

After the cleaning of the cavities 2, the complete removal of the coating material 3 from the cavities 2 is carried out. Preferably, the coating material 3 is removed at least partially during the cleaning process of the cavities, but in particular after the complete removal of all contaminants.

In this case, the cleaning of the cavities 2 preferably takes place in a solution bath; especially preferably, multiple semiconductor substrates 1 are stored in a solvent bath in a batch process. The temperature of a solvent, present in the solvent bath, far dissolving the coating material 3 is set in particular greater than 30° C., preferably greater than 50° C., more preferably greater than 75° C., and most preferably greater than 100° C.

In a special embodiment, the semiconductor substrates 1 with the cavities 2 to be cleaned are exposed to ultrasound. The ultrasound emitters in this case can produce ultrasound waves, whose propagation direction lies normal or crosswise to the substrate surface. Also, an acoustic irradiation of the semiconductor substrates 1 by ultrasound waves, whose propagation direction lies between the normal and a parallel to the substrate surface, would be conceivable.

The chemicals for the solvent that are preferably to be used primarily depend on the type of contamination. Primarily in the case of the contamination of cavities 2 by a temporary adhesive, corresponding solvents are preferred for the temporary adhesive. These are solvents that contain primarily, but not exclusively, limonenes.

Additional solvents that are conceivable according to the invention would be:
Organic solvents
Acetone
Isopropanol
PGMEA
Mesitylene
Limonin
Isododecane
Inorganic solvents
Water Any semiconductor substrate 1 with its substrate surface 1o has at least one cavity 2. In a special case, the cavity 2 is a via (FIG. 4a). A via is primarily distinguished by the large diameter-to-depth ratio D:t. Vias are cavities with a diameter-to-depth ratio of 1:1, preferably more than 1:2, more preferably more than 1:10, most preferably more than 1:50, and with utmost preference more than 1:100. In general, cavities that are then no longer referred to as vias can also have a diameter-to-depth ratio of 1:1, preferably more than 2:1, more preferably more than 10:1, most preferably more than 50:1, and with utmost preference more than 100:1.

In a first process step, the substrate surface 1o is coated with a coating material 3 (FIG. 4b). The coating is done with an above-mentioned coating method, in particular by spin-coating.

A surface 3o of the coating material 3 has a low adhesion to other materials.

In another process step, the semiconductor substrate 1 is processed with a material, here by exposure to an adhesive 4, in particular an adhesive for the temporary bonding. The processing results in particular in that the adhesive 4 penetrates into the cavities 2 (see FIG. 4c).

After the processing of the semiconductor substrate 1 is carried out, the adhesive 4 is removed from the cavities 2 by cleaning means 5. As cleaning means 5, in particular chemical solvents and/or gases and/or plasma and/or ultrasound waves and/or light are used.

By the application of the low-adhesive coating material 3 according to the invention, the removal of contaminants such as adhesive 4 is possible in a very short time with very low expenditure of energy.

After the removal of the adhesive 4 is performed, the removal of the protective layer 3 (FIG. 4e) is carried out. Especially preferably, the coating material 3 is removed as early as during the cleaning process (FIG. 4d), in particular after the removal of the adhesive 4.

The preferred method for removing the coating material 3 according to the invention is the application of plasma, in particular oxygen plasma.

LIST OF REFERENCE SYMBOLS

1 Semiconductor substrate
1o Surface of the semiconductor substrate
1z Intermediate surfaces
2 Cavities
2b Base
2i Inner periphery
2o Surface of the cavities
3 Coating material
3o Surface of the coating material
4 Adhesive
5 Cleaning means
d Coating thickness
D Mean diameter Having described the invention, the following is claimed:

1. A method for temporarily coating a semiconductor substrate having at least one substrate surface and one or more cavity surfaces that define cavities formed in the semiconductor substrate, said method comprising:
applying a temporary coating material to the semiconductor substrate before performing processing steps for processing the at least one substrate surface,
wherein the temporary coating material applied to the semiconductor substrate includes (i) a high-adhesive part, which removably adheres to the one or more cavity surfaces, and (ii) a low-adhesive part, which faces interior regions of the cavities and thus comes into contact with contaminants.

2. The method according to claim 1, wherein the step of applying the temporary coating material to the semiconductor substrate includes applying the temporary coating material at least to an inner periphery surface and a base surface of the cavity surfaces, said temporary coating material applied with a coating thickness (d) that is smaller than half a mean diameter (D) of each of the cavities.

3. The method according to claim 1, wherein the step of applying the temporary coating material to the semiconductor substrate includes applying the temporary coating material to intermediate surfaces of the substrate surfaces, said intermediate surfaces extending between the cavities.

4. The method according to claim 3, wherein the method further comprises:
removing the temporary coating material from the intermediate surfaces after applying the temporary coating material to the semiconductor substrate, without removing the temporary coating material applied to the one or more cavity surfaces.

5. The method according to claim 4, wherein the temporary coating material is removed from the intermediate surfaces by centrifuging.

6. The method according to claim 1, further comprising:
cleaning the semiconductor substrate after performing the processing steps for processing the at least one substrate surface.

7. The method according to claim 1, furthered comprising:
removing the temporary coating material from the cavities after performing the processing steps for process the at least one substrate surface; and
immediately after the removing of the coating materials, permanently coating the one or more cavity surfaces and/or equipping the cavities.

8. The method according to claim 6, wherein the method further comprises removing the temporary coating material after cleaning the semiconductor substrate.

9. The method according to claim 7, wherein the temporary coating material is removed by introducing the coated semiconductor substrate into a solvent bath filled with a solvent for dissolving the temporary coating material.

10. The method according to claim 9, wherein the semiconductor substrate is exposed to ultrasound in the solvent bath.

11. The method according to claim 4, wherein the temporary coating material is completely removed from the intermediate surfaces.

12. The method according to claim 5, wherein the temporary coating material is removed from the intermediate surfaces by centrifuging in connection with applying a solvent for at least partially dissolving the temporary coating material.

13. The method according to claim 7, wherein the temporary coating material is removed after cleaning of the semiconductor substrate.

14. The method according to claim 13, wherein the temporary coating material is removed by introducing the coated semiconductor substrate into a solvent bath filled with a solvent for dissolving the temporary coating material.

15. The method according to claim 14, wherein the semiconductor substrate is exposed to ultrasound in the solvent bath.

16. The method according to claim 1, wherein the cavities are recesses.

17. The method according to claim 1, wherein the cavities are vias.

18. The method according to claim 17, wherein each via is one of the following: a bore hole, a clearance hole, or a contact hole.

19. The method according to claim 13, wherein the temporary coating material is removed by plasma.

20. The method according to claim 1, wherein an energy per unit of surface area of the high-adhesive part that is needed to separate the high-adhesive part from the one or more cavity surfaces is greater than 0.00001 $J/m^2$, and
wherein an energy per unit of surface area of the low-adhesive part at which the low-adhesive part adheres to the contaminants is less than 2.5 $J/m^2$.

* * * * *